US012687589B2

(12) United States Patent
Bae et al.

(10) Patent No.: US 12,687,589 B2
(45) Date of Patent: Jul. 21, 2026

(54) APPARATUS AND METHOD FOR DIAGNOSING BATTERY

(71) Applicant: LG ENERGY SOLUTION, LTD., Seoul (KR)

(72) Inventors: Yoon-Jung Bae, Daejeon (KR); Ju-Ri Kim, Daejeon (KR); Tae-In Kim, Daejeon (KR); Seon-Ho Pak, Daejeon (KR); Kyung-Eun Sun, Daejeon (KR); Hee-Seok Jeong, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 19/042,791

(22) Filed: Jan. 31, 2025

(65) Prior Publication Data

US 2025/0244403 A1 Jul. 31, 2025

(30) Foreign Application Priority Data

Jan. 31, 2024 (KR) ........................ 10-2024-0015272

(51) Int. Cl.
| | |
|---|---|
| *G01R 31/392* | (2019.01) |
| *G01R 31/367* | (2019.01) |
| *G01R 31/3835* | (2019.01) |
| *H01M 10/44* | (2006.01) |

(52) U.S. Cl.
CPC ......... *G01R 31/392* (2019.01); *G01R 31/367* (2019.01); *G01R 31/3835* (2019.01); *H01M 10/44* (2013.01)

(58) Field of Classification Search
CPC ... G01R 31/392; G01R 31/367; H01M 10/44; H01M 10/48
See application file for complete search history.

(56) References Cited

U.S. PATENT DOCUMENTS

| | | | |
|---|---|---|---|
| 2012/0169288 A1 | 7/2012 | Ueki | |
| 2016/0195589 A1 | 7/2016 | Hanyu | |
| 2018/0226693 A1* | 8/2018 | Hong | H02J 7/00714 |
| 2021/0190878 A1 | 6/2021 | Lee et al. | |
| 2022/0390524 A1* | 12/2022 | Takegami | G01R 31/378 |
| 2023/0014689 A1 | 1/2023 | Ogasawara et al. | |

(Continued)

FOREIGN PATENT DOCUMENTS

| | | |
|---|---|---|
| EP | 4135099 A1 | 2/2023 |
| EP | 4155747 A1 | 3/2023 |

(Continued)

*Primary Examiner* — Ricky Go

(74) *Attorney, Agent, or Firm* — Bryan Cave Leighton Paisner LLP

(57) ABSTRACT

A battery diagnosing apparatus according to one embodiment of the present disclosure includes: a profile acquisition unit that acquires a battery profile representing a correspondence between a voltage and a capacity of a battery; and a control unit that divides a capacity section of the battery profile into a plurality of sections, derives a target value for one target index related to a differential capacity peak or a charging capacity ratio among a plurality of diagnosis indices set in advance, from each of the divided sections, compares a correspondence between the derived plurality of target values with a preset reference profile that represents a correspondence between a plurality of target indices, and diagnoses a state of the battery based on a result of the comparison.

20 Claims, 8 Drawing Sheets

(56)                    References Cited

U.S. PATENT DOCUMENTS

| | | |
|---|---|---|
| 2023/0122626 A1 | 4/2023 | Asai |
| 2023/0140094 A1 | 5/2023 | Cha et al. |
| 2023/0160970 A1 | 5/2023 | Choi et al. |
| 2023/0160971 A1 | 5/2023 | Cha et al. |
| 2023/0176128 A1 | 6/2023 | Bae et al. |
| 2023/0179007 A1 | 6/2023 | Bae et al. |
| 2023/0184843 A1 | 6/2023 | Bae et al. |
| 2023/0194620 A1* | 6/2023 | Choi ..................... H01M 10/42 |
| | | 702/63 |
| 2023/0318057 A1 | 10/2023 | Yoon |
| 2023/0333174 A1 | 10/2023 | Choi et al. |
| 2024/0044995 A1 | 2/2024 | Bae et al. |
| 2024/0402259 A1 | 12/2024 | Choi et al. |

FOREIGN PATENT DOCUMENTS

| | | | |
|---|---|---|---|
| EP | 4175013 | A1 | 5/2023 |
| JP | 5832380 | B2 | 11/2015 |
| JP | 2021197832 | A | 12/2021 |
| JP | 7000033 | B2 | 2/2022 |
| JP | 202319692 | A | 5/2023 |
| KR | 1020210150217 | A | 12/2021 |
| KR | 102351637 | B1 | 1/2022 |
| KR | 10-2022-0065604 | A | 5/2022 |
| KR | 1020220067328 | A | 5/2022 |
| KR | 10-2022-0094042 | A | 7/2022 |
| KR | 10-2022-0107550 | A | 8/2022 |
| KR | 1020220107549 | A | 8/2022 |
| KR | 1020230019705 | A | 2/2023 |
| KR | 102618037 | B1 | 12/2023 |
| WO | 2019-033391 | A1 | 2/2019 |

* cited by examiner

FIG. 3

| Target Index | Description |
| --- | --- |
| Number of differential voltage peaks | Number of peaks included in first differential profile (Q-dVdQ prifle) |
| Capacity of differential voltage peak | Capacity of any one peak included in first differential profile |
| Differential voltage of differential voltage peak | Differential voltage of any one peak included in first differential profile |
| Differential voltage area | Area of first differential profile |
| Number of differential capacity peaks | Number of peaks included in second differential profile (V-dQdV profile) |
| Voltage of differential capacity peak | Voltage of any one peak included in second differential profile |
| Differential capacity of differential capacity peak | Differential capacity of any one peak included in second differential profile |
| Differential capacity area | Area of second differential profile |
| Discharge end voltage | OCV after discharging of battery is ended |
| Charge end voltage | OCV after charging of battery is ended |
| Section resistance | Resistance of section |
| Charging efficiency | Difference between charging capacity and discharging capacity of section |
| Section capacity | Capacity of section |
| CC charging capacity ratio | Ratio of CC charging capacity to CC charging capacity and CV charging capacity |

APPARATUS AND METHOD FOR DIAGNOSING BATTERY

CROSS-REFERENCE TO RELATED APPLICATIONS

This application is based on and claims priority from Korean Patent Application No. 10-2024-0015272 filed on Jan. 31, 2024, with the Korean Intellectual Property Office, the disclosure of which is incorporated herein in its entirety by reference.

TECHNICAL FIELD

The present disclosure relates to a battery diagnosing apparatus and method, and more specifically, to a battery diagnosing apparatus and method for diagnosing the state of a battery.

BACKGROUND

Recently, as the demand for portable electronic products such as notebook computers, video cameras, and portable telephones has rapidly increased, and as the development of electric vehicles, energy storage batteries, robots, and satellites has begun in earnest, researches on high-performance batteries allowing repeated charging and discharging are actively underway.

Currently, commercialized batteries include, for example, nickel-cadmium batteries, nickel-hydrogen batteries, nickel-zinc batteries, and lithium batteries. Of these batteries, lithium batteries are gaining considerable attention due to their advantages including a substantially low memory effect to allow a high degree of freedom in charging and discharging, a very low self-discharging rate, and high energy density, as compared to nickel-based batteries.

While many studies are being conducted on the batteries focusing on the high-capacity and the high-density, it is also important to improve the lifespan and the safety of the batteries. In order to enhance the safety of batteries, a technology is necessary, which may accurately diagnose the current state of batteries.

SUMMARY

The present disclosure provides a battery diagnosing apparatus and method capable of diagnosing the state of a battery and controlling the battery based on the diagnosis result.

Various aspects of the present disclosure may be understood through the following description and will become more apparent from the embodiments of the present disclosure. In addition, it will be readily understood that various aspects of the present disclosure may be implemented by the means and combinations thereof as described in the claims.

A battery diagnosing apparatus according to one aspect of the present disclosure may include: a profile acquisition unit that acquires a battery profile representing a correspondence between a voltage and a capacity of a battery; and a control unit that divides a capacity section of the battery profile into a plurality of sections, derives a target value for one target index related to a differential capacity peak or a charging capacity ratio among a plurality of diagnosis indices set in advance, from each of the divided sections, compares a correspondence between the derived plurality of target values with a preset reference profile that represents a correspondence between a plurality of target indices, and diagnoses a state of the battery based on a result of the comparison.

The control unit may be configured to determine a number of a plurality of differential capacity peaks included in a differential profile corresponding to the battery profile, the differential profile representing a correspondence between a voltage and a differential capacity, an area of the differential profile, a voltage of a main peak among the plurality of differential capacity peaks, or a differential capacity of the main peak, as a target index corresponding to a low-capacity section among the plurality of sections.

The control unit may be configured to determine the charging capacity ratio as a target index corresponding to a high-capacity section among the plurality of sections.

The control unit may be configured to diagnose the state of the battery as a positive negative electrode deterioration state when a target point indicating the correspondence between the plurality of target values is included in the reference profile.

The control unit may be configured to diagnose the state of the battery as a negative electrode deterioration state when the target point is included in a first region based on the reference profile.

The control unit may be configured to diagnose the state of the battery as a positive electrode deterioration state when the target point is included in a second region based on the reference profile.

The control unit may be configured to diagnose the state of the battery as an end of life (EOL) state when the target point is included in a third region.

The third region is configured to be preset as a region that exceeds a preset threshold value for each of the plurality of target indices.

The control unit may be configured to reduce at least one of an upper limit current-rate (C-rate) and a constant voltage charging time set for the battery when the state of the battery is diagnosed as the positive electrode deterioration state or the positive negative electrode deterioration state.

The control unit may be configured to reduce an upper charge limit voltage set for the battery when the state of the battery is diagnosed as the negative electrode deterioration state or the positive negative electrode deterioration state.

The control unit may be configured to divide the capacity section into a first section and a second section based on a division ratio or a target capacity set in advance.

The profile acquisition unit may be configured to further acquire a differential profile corresponding to the battery profile.

The control unit may be configured to determine a main peak from the differential profile and divide the capacity section based on a capacity of the determined main peak.

The differential profile may be configured to represent a correspondence between a capacity of the battery and a differential voltage.

The control unit may be configured to determine a plurality of local minimum points in the differential profile, and determine a local minimum point with a smallest corresponding differential voltage among the determined plurality of local minimum points, as the main peak.

The differential profile may be configured to represent a correspondence between a voltage and a differential capacity of the battery.

The control unit may be configured to determine a plurality of local maximum points in the differential profile, and determine a local maximum point with a largest corresponding differential voltage among the determined plurality of local maximum points, as the main peak.

A battery pack according to another aspect of the present disclosure may include the battery diagnosing apparatus according to one embodiment of the present disclosure.

A vehicle according to yet another aspect of the present disclosure may include the battery diagnosing apparatus according to one embodiment of the present disclosure.

A battery diagnosing method according to still another aspect of the present disclosure may include: a profile acquisition step of acquiring a battery profile representing a correspondence between a voltage and a capacity of a battery: a section division step of dividing a capacity section of the battery profile into a plurality of sections; a target value derivation step of deriving a target value for one target index related to a differential capacity peak or a charging capacity ratio among a plurality of diagnosis indices set in advance, from each of the sections: a comparison step of comparing a correspondence between the derived plurality of target values with a preset reference profile that represents a correspondence between a plurality of target indices; and a diagnosis step of diagnosing a state of the battery based on a result of the comparison.

The battery diagnosing method according to still another aspect of the present disclosure may further include a target index determination step of determining a number of a plurality of differential capacity peaks included in a differential profile corresponding to the battery profile, the differential profile representing a correspondence between a voltage and a differential capacity, an area of the differential profile, a voltage of a main peak among the plurality of differential capacity peaks, or a differential capacity of the main peak, as a target index corresponding to a low-capacity section among the plurality of sections, and determining the charging capacity ratio as a target index corresponding to a high-capacity section among the plurality of sections The diagnosis step may include: diagnosing the state of the battery as a positive negative electrode deterioration state when a target point indicating the correspondence between the plurality of target values is included in the reference profile: diagnosing the state of the battery as a negative electrode deterioration state when the target point is included in a first region based on the reference profile; and diagnosing the state of the battery as a positive electrode deterioration state when the target point is included in a second region based on the reference profile.

The diagnosis step may include diagnosing the state of the battery as an end of life (EOL) state when the target point is included in a third region.

The battery diagnosing method according to still another aspect of the present disclosure may further include a battery control step of reducing at least one of an upper limit current-rate (C-rate) and a constant voltage charging time set for the battery when the state of the battery is diagnosed as the positive electrode deterioration state or the positive negative electrode deterioration state.

The battery diagnosing method according to still another aspect of the present disclosure may further include a battery control step of reducing an upper charge limit voltage set for the battery when the state of the battery is diagnosed as the negative electrode deterioration state or the positive negative electrode deterioration state.

The section division step includes dividing the capacity section into a first section and a second section based on a division ratio or a target capacity set in advance.

A non-transitory computer-readable storage medium according to still yet another aspect of the present disclosure may have stored therein a program that, when executed, causes a computer to perform a battery diagnosing method including: a profile acquisition step of acquiring a battery profile representing a correspondence between a voltage and a capacity of a battery: a section division step of dividing a capacity section of the battery profile into a plurality of sections: a target value derivation step of deriving a target value for one target index related to a differential capacity peak or a charging capacity ratio among a plurality of diagnosis indices set in advance, from each of the divided sections: a comparison step of comparing a correspondence between the derived plurality of target values with a preset reference profile that represents a correspondence between a plurality of target indices; and a diagnosis step of diagnosing a state of the battery based on a result of the comparison.

The battery diagnosing apparatus according to one aspect of the present disclosure may diagnose the state of the battery in various aspects according to a combination of various target indices.

Since the target value for each section is a value indicating the state of the battery corresponding to the corresponding section, the state of the battery may be separated and diagnosed in more detail based on the correspondence between the plurality of target values.

The effects of the present disclosure are not limited to those mentioned above, and other effects not mentioned will be clearly understood by those skilled in the art from the description of the claims.

BRIEF DESCRIPTION OF THE DRAWINGS

The following drawings attached hereto exemplify embodiments of the present disclosure and serve to further understand the technical idea of the present disclosure together with the detailed description of the disclosure to be described later. Therefore, the present disclosure should not be construed as being limited to the matters illustrated in the drawings.

FIG. 3 is a schematic diagram illustrating a plurality of target indices, according to one embodiment of the present disclosure.

DETAILED DESCRIPTION

Figure 1:
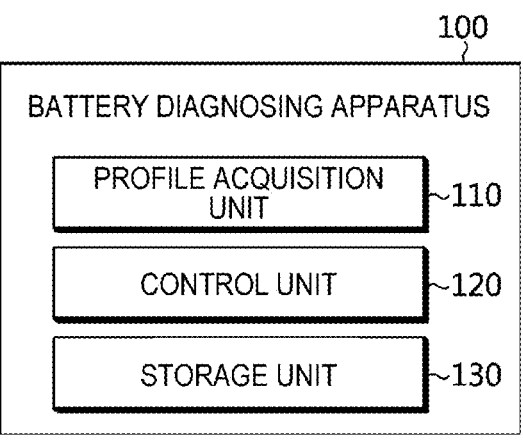
FIG. 1 is a schematic diagram illustrating a battery diagnosing apparatus, according to one embodiment of the present disclosure.

Words and terms used in the detailed description and the claims herein should not be interpreted to be limited to their usual or dictionary meanings, but should be interpreted to have meanings and concepts that correspond to the technical idea of the present disclosure in compliance with the principle that inventors may appropriately define terms and concepts for the purpose of best describing the present disclosure.

Accordingly, it can be appreciated that the embodiments described herein and the configurations illustrated in the drawings are merely examples of the present disclosure, which do not exhaustively represent the technical idea of the present disclosure, and various equivalents and modifications may be made to substitute the present disclosure at the time of filing the present disclosure.

When describing the present disclosure, detailed description of related known configurations or functions may be omitted if determined to obscure the gist of the present disclosure.

Terms with ordinal numbers such as first, second, and so on, may be used to discriminate one of the various components from the other, but should not be interpreted as limiting the components.

Throughout the descriptions herein, when a certain part "includes" a specific component, this description does not indicate that the certain part excludes other components, but indicates that the certain part may further include other components, unless otherwise defined.

Further, throughout the descriptions herein, when two components are "connected" to each other, this description indicates not only that the two components are "directly connected" to each other, but also that the two components are "indirectly connected" to each other via another component.

Hereinafter, embodiments of the present disclosure are described in detail with reference to the accompanying drawings.

FIG. 1 is a schematic diagram illustrating a battery diagnosing apparatus 100 according to one embodiment of the present disclosure.

Referring to FIG. 1, the battery diagnosing apparatus 100 may include a profile acquisition unit 110, a control unit 120, and a storage unit 130.

Here, a battery indicates a single isolated cell that is physically separable, and has a negative electrode terminal and a positive electrode terminal. For example, a lithium-ion battery or a lithium-polymer battery may be considered as the battery. The type of battery may be a cylindrical type, a prismatic type, or a pouch type. Further, the battery may indicate a battery bank, a battery module, or a battery pack, in which a plurality of cells is connected to each other in series and/or in parallel. Hereinafter, for the convenience of description, descriptions are made assuming that the battery indicates a single isolated cell.

The profile acquisition unit 110 may be configured to acquire a battery profile BP indicating a correspondence between the voltage and capacity of the battery.

For example, the battery profile BP is a profile that represents a relationship between the voltage V and the capacity Q when the capacity of the battery is charged from a preset start charge capacity or 0% to a preset end charge capacity or 100%. In another example, the battery profile BP may represent the relationship between the voltage V and the capacity Q when the capacity of the battery is discharged from a preset start discharge capacity or 100% to a preset end discharge capacity or 0%.

For example, there is no special limitation on the current-rate (C-rate) in the charge or discharge for generating the battery profile BP. However, in order to obtain a more accurate battery profile BP and differential profile, the battery should be charged or discharged at a low rate. For example, a battery profile BP may be generated in the process of charging or discharging the battery at 0.05 C.

The profile acquisition unit 110 may acquire a battery profile BP in the following manner.

For example, the profile acquisition unit 110 may directly read or receive a battery profile BP of the battery from the outside. For example, the profile acquisition unit 110 may acquire a battery profile BP by being connected to the outside by wire and/or wirelessly and reading or receiving the battery profile BP.

In another example, the profile acquisition unit 110 may directly generate a battery profile BP based on battery information about the voltage and capacity of the battery. For example, the profile acquisition unit 110 may acquire a battery profile BP by directly generating the battery profile BP based on the battery information.

Figure 2:
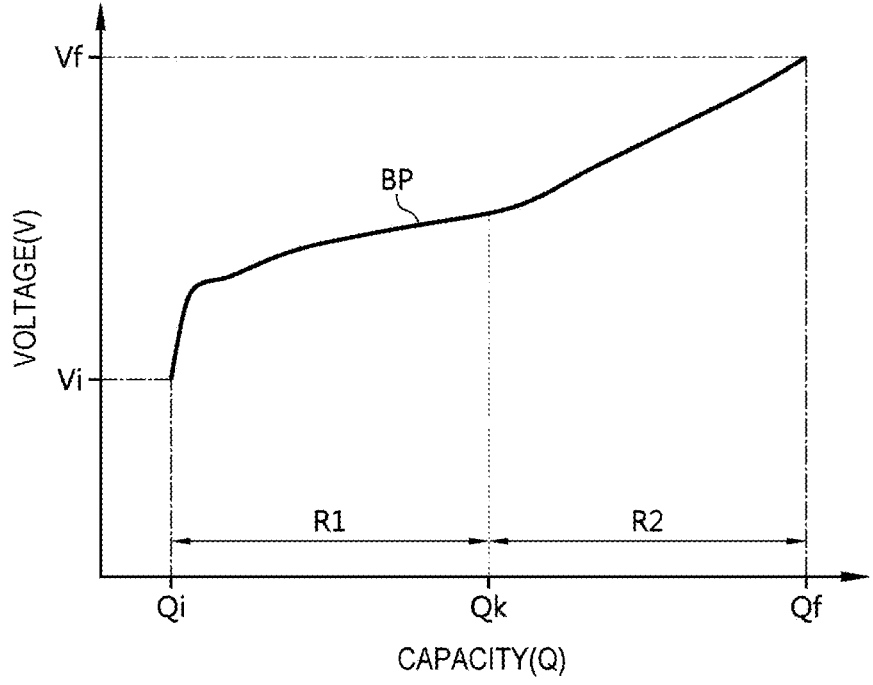
FIG. 2 is a schematic diagram illustrating a battery profile, according to one embodiment of the present disclosure.

FIG. 2 is a schematic diagram illustrating a battery profile BP according to one embodiment of the present disclosure. In the embodiment of FIG. 2, the battery profile BP may be expressed as an X-Y graph in which the X-axis is set to a capacity Q and the Y-axis is set to a voltage V.

The profile acquisition unit 110 may be communicably connected to the control unit 120. For example, the profile acquisition unit 110 may be wired or wirelessly connected to the control unit 120. In an example, the profile acquisition unit 110 may transmit the acquired battery profile BP to the control unit 120. In another example, the control unit 120 may read the battery profile BP from the profile acquisition unit 110.

According to one embodiment, the control unit 120 may be configured to divide a capacity section of the battery profile BP into a plurality of sections.

For example, the control unit 120 may divide the entire capacity section of the battery profile BP into two or more sections. For example, in the embodiment of FIG. 2, the entire capacity section of the battery profile BP is Qi to Qf. The control unit 120 may divide the capacity section of Qi to Qf into a first section R1 and a second section R2 based on Qk.

The control unit 120 may be configured to derive a target value for one target index related to a differential capacity peak or a charging capacity ratio among a plurality of preset diagnosis indices in each section.

For example, a plurality of diagnosis indices may be preset for each of the plurality of sections. Here, the diagnosis indices are indices representing the state of the battery in the corresponding section and may be used to diagnose the state of the battery in the corresponding section. For example, since there are special indices that may only be derived from each of the plurality of sections, some or all of the diagnosis indices set for each of the plurality of sections may be different.

FIG. 3 is a schematic diagram illustrating a plurality of target indices, according to one embodiment of the present disclosure.

(1) The number of differential voltage peaks is the number of peaks included in the corresponding section of a first differential profile. For example, the number of local maximum points and/or local minimum points included in the corresponding section of the first differential profile may be determined as the number of differential voltage peaks.

The differential voltage peak means a peak included in the first differential profile in which the battery profile BP is differentiated with respect to the capacity. For example, when the battery profile BP is differentiated with respect to the capacity, the first differential profile may be derived, which indicates a correspondence between the capacity Q and the differential voltage dV/dQ. And, the first differential profile may include a plurality of differential voltage peaks. Here, the differential voltage peak means a local maximum point and/or local minimum point included in the first differential profile.

(2) The capacity of the differential voltage peak is a capacity of the target peak included in the corresponding section of the first differential profile. For example, among one or more local maximum points included in the corresponding section of the first differential profile, the peak with the largest corresponding differential voltage may be determined as the target peak. The target peak may be changed depending on the state of the battery to be diagnosed.

(3) The differential voltage of the differential voltage peak is a differential voltage of the target peak included in the corresponding section of the first differential profile.

(4) The differential voltage area is an area of the corresponding section of the first differential profile. The integrated value for the capacity in the corresponding section of the first differential profile may be determined as the differential voltage area.

(5) The number of differential capacity peaks is the number of peaks included in the corresponding section of a second differential profile. For example, the number of local maximum points and/or local minimum points included in the corresponding section of the second differential profile may be determined as the number of differential voltage peaks.

Here, the differential capacity peak means a peak included in the second differential profile in which the battery profile BP is differentiated with respect to voltage. For example, when the battery profile BP is differentiated with respect to voltage, the second differential profile may be derived, which indicates a correspondence between the voltage V and the differential capacity dQ/dV. And, the first differential profile may include a plurality of differential capacity peaks. Here, the differential capacity peak means a local maximum point and/or local minimum point included in the second differential profile.

(6) The voltage of the differential capacity peak is a voltage of the target peak included in the corresponding section of the second differential profile. For example, among one or more local maximum points included in the corresponding section of the second differential profile, the peak with the largest corresponding differential capacity may be determined as the target peak. The target peak may be changed depending on the state of the battery to be diagnosed.

(7) The differential capacity of the differential capacity peak is a differential capacity of the target peak included in the corresponding section of the second differential profile.

(8) The differential capacity area is an area of the corresponding section of the second differential profile. The integrated value for the voltage in the corresponding section of the second differential profile may be determined as the differential capacity area.

(9) The discharge end voltage refers to an open circuit voltage (OCV) after the discharge of the battery is ended. Since the discharge end voltage may be derived when the discharge of the battery is ended, it is a diagnosis index that may be derived only in the low-capacity section. For example, the discharge end voltage may be derived in the low-capacity section corresponding to the voltage set to end the discharge of the battery.

(10) The charge termination voltage refers to an OCV after the charge of the battery is ended. Since the charge end voltage may be derived when the charge of the battery is ended, it is a diagnosis index that may only be derived in a high-capacity section. For example, the charge end voltage may be derived in the high-capacity section corresponding to the voltage set to end the charge of the battery.

(11) The section resistance refers to a ratio of the voltage change amount to the charge/discharge current of the corresponding section.

(12) The charging efficiency refers to a difference between the charging capacity and the discharging capacity. For example, the charging efficiency of the low-capacity section in the nth cycle may be calculated according to the formula of "charging capacity of the nth cycle-discharging capacity of the nth cycle." And, the charging efficiency of the high-capacity section in the nth cycle may be calculated according to the formula of "discharging capacity of the nth cycle-charging capacity of the (n+1) th cycle." For example, the charging efficiency is not limited to the corresponding section, but may be calculated according to the total charging/discharging capacity of the cycle.

(13) The section capacity refers to a capacity of the section.

(14) The CC charging capacity ratio refers to a ratio of the constant current (CC) charging capacity to the CC charging capacity and the constant voltage (CV) charging capacity. Since the CV charging is performed at the end of the charging, the CC charging capacity ratio is a diagnosis index that may be derived only in the high-capacity section. For example, the CC charging capacity ratio may be derived in the high-capacity section corresponding to the voltage set to end the charge of the battery.

In one embodiment, the control unit 120 may determine a diagnosis index regarding the differential capacity peak or the charging capacity ratio among the plurality of diagnosis indices as described above for each of the plurality of sections, as a target index.

For example, the control unit 120 may be configured to determine the number of a plurality of differential capacity peaks included in the differential profile representing a correspondence between a voltage and a differential capacity as a differential profile corresponding to the battery profile, an area of the differential profile, a voltage of a main peak among the plurality of differential capacity peaks, or a differential capacity of the main peak, as a target index corresponding to a low-capacity section among the plurality of sections.

As such, in the embodiment of FIG. 3, the control unit 120 may determine one of the number of differential capacity peaks, the voltage of the differential capacity peaks, the differential capacity of the differential capacity peaks, and the differential capacity area, as a target index for the low-capacity section.

In addition, the control unit 120 may be configured to determine the charging capacity ratio as a target index corresponding to a high-capacity section among the plurality of sections.

In this way, in the embodiment of FIG. 3, the control unit 120 may determine the CC charging capacity ratio as a target index for the high-capacity section.

The control unit 120 may be configured to compare the correspondence between the derived plurality of target values with a reference profile that is preset to indicate the correspondence between the plurality of target indices.

According to one embodiment, it is assumed that the capacity section of the battery profile BP is divided into a first section R1 and a second section R2, and a first target value for the target index is derived in the first section R1, and a second target value for the target index is derived in the second section R2. The control unit 120 may compare the target point indicating the correspondence between the plurality of target values with the reference profile.

Figure 4:
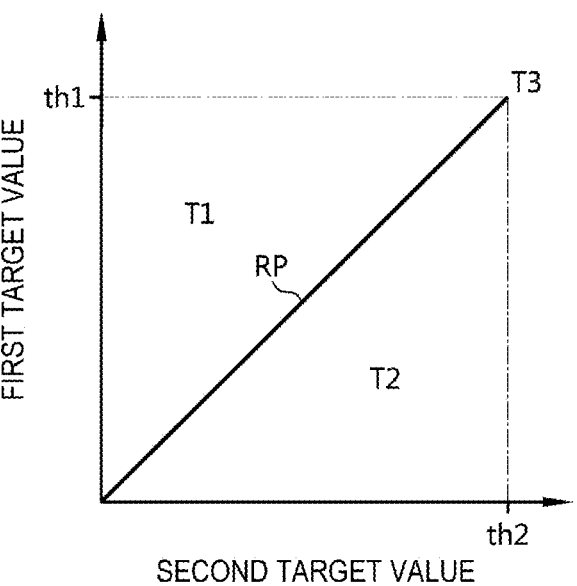
FIG. 4 is a schematic diagram illustrating a reference profile, according to one embodiment of the present disclosure.

FIG. 4 is a schematic diagram illustrating a reference profile, according to one embodiment of the present disclosure. In the embodiment of FIG. 4, the reference profile may be expressed as an X-Y graph in which the X-axis is set to the second target value, and the Y-axis is set to the first target value.

The control unit 120 may determine whether the target point is included in the reference profile. When the target point is not included in the reference profile, the control unit 120 may determine which of a first region T1, a second region T2, and a third region T3 the target point is included in.

The first region T1 is a region where the first target value is greater than the reference profile. For example, in the embodiment of FIG. 4, the first region T1 is a region where the first target value of the target point exceeds the first target value of the reference profile based on the same second target value.

The second region T2 is a region where the second target value is greater than the reference profile. For example, in the embodiment of FIG. 4, the second region T2 is a region where the second target value of the target point exceeds the second target value of the reference profile based on the same first target value.

The third region T3 may be configured to be preset as a region that exceeds a preset threshold value for each of the plurality of target indices. The threshold value may be set independently for each of the first target value and the second target value. For example, in the embodiment of FIG. 4, the third region T3 is a region where the first target value of the target point exceeds a first threshold value th1 and the second target value of the target point exceeds a second threshold value th2.

In the embodiment of FIG. 4, the target point may be included in the reference profile, the first region T1, the second region T2, or the third region T3.

The control unit 120 may be configured to diagnose the state of the battery based on the comparison result.

For example, the control unit 120 may be configured to diagnose the state of the battery as a positive negative electrode deterioration state when a target point indicating the correspondence between the plurality of target values is included in the reference profile. Here, the positive negative electrode deterioration state is a state where both the positive and negative electrodes of the battery are deteriorated, and the deterioration degrees of the positive and negative electrodes are balanced.

In another example, the control unit 120 may be configured to diagnose the state of the battery as a negative electrode deterioration state when the target point is included in the first region T1 based on the reference profile. Here, the negative electrode deterioration state is a state where the deterioration of the negative electrode of the battery is more dominant than the deterioration of the positive electrode. For example, the negative electrode deterioration state is a state where the deterioration of the positive and negative electrodes is not balanced, and the deterioration of the negative electrode is more advanced than the deterioration of the positive electrode. For example, the negative electrode deterioration state is related to the loss of available lithium. When available lithium is lost, lithium plating (Li-plating), in which lithium metal is deposited on the surface of the negative electrode, may occur.

In another example, the control unit 120 may be configured to diagnose the state of the battery as a positive electrode deterioration state when the target point is included in the second region T2 based on the reference profile. Here, the positive electrode deterioration state is a state where the positive electrode of the battery is deteriorated, and the deterioration of the positive electrode is more dominant than the deterioration of the negative electrode. For example, the positive electrode deterioration state is a state where the deterioration of the positive and negative electrodes is not balanced, and the deterioration of the positive electrode is more advanced than the deterioration of the negative electrode.

In another example, the control unit 120 may be configured to diagnose the state of the battery as an end of life (EOL) state when the target point is included in the third region T3. The EOL state refers to a state where the deterioration of the battery is significantly advanced, and use of the battery is not recommended. For example, the EOL state may be a state where the battery may be determined to be unusable.

The battery diagnosing apparatus 100 according to one embodiment of the present disclosure may diagnose the state of the battery according to the correspondence between target values calculated in each of a plurality of sections. That is, according to one embodiment of the present disclosure, the state of the battery may be diagnosed in various aspects according to the combination of various target indices.

Since the target value for each section is a value indicating the state of the battery corresponding to the corresponding section, the state of the battery may be separated and diagnosed in more detail based on the correspondence between the plurality of target values.

The profile acquisition unit 110 and/or the control unit 120 equipped in the battery diagnosing apparatus 100 may optionally include a processor, an application-specific integrated circuit (ASIC), another chipset, a logic circuit, a register, a communication modem, and a data processing device known in the art to execute various control logics performed in the present disclosure. In addition, when the control logic is implemented as software, the profile acquisition unit 110 and/or the control unit 120 may be implemented as a set of program modules. At this time, the program modules may be stored in a memory and executed by the profile acquisition unit 110 and/or the control unit 120. The memory may be located inside or outside the profile acquisition unit 110 and/or the control unit 120, and may be connected to the profile acquisition unit 110 and/or the control unit 120 by various well-known means.

The battery diagnosing apparatus 100 may further include a storage unit 130. The storage unit 130 may store data or programs required for each component of the battery diagnosing apparatus 100 to perform operations and functions, or data generated in the process of performing operations and functions. The storage unit 130 is not particularly limited in its type as long as it is a known information storage means known to be able to record, erase, update, and read data. In an example, the information storage means may include a random access memory (RAM), a flash memory, a read-only memory (ROM), an electronically erasable programmable read-only memory (EEPROM), and a register. In addition, the storage unit 130 may store program codes in which processes executable by the profile acquisition unit 110 and/or the control unit 120 are defined.

For example, the storage unit 130 may store battery information, a battery profile BP, differential profile, and battery diagnosis information by the control unit 120.

The control unit 120 may be configured to control the battery based on the diagnosis results regarding the state of the battery. For example, the control unit 120 may change the usage conditions of the battery based on the diagnosis results.

In an example, the control unit 120 may be configured to reduce at least one of an upper limit C-rate and a constant voltage charging time set for the battery when the state of the battery is diagnosed as the positive electrode deterioration state or the positive negative electrode deterioration state. For example, when it is diagnosed that the positive electrode of the battery is deteriorated, the control unit 120 may change the usage conditions of the battery to suppress further deterioration of the positive electrode of the battery.

In another example, the control unit 120 may be configured to reduce an upper charge limit voltage set for the battery when the state of the battery is diagnosed as the negative electrode deterioration state or the positive negative electrode deterioration state. When it is diagnosed that the negative electrode of the battery is deteriorated, the control unit 120 may change the usage conditions of the battery to suppress further deterioration of the negative electrode of the battery.

As the usage conditions of the battery change, the deterioration of the positive and/or negative electrodes of the battery may be slowed down, so that the expected life of the battery may be increased.

The control unit 120 may be configured to divide the capacity section into a first section R1 and a second section R2 based on a division ratio or a target capacity set in advance.

In one embodiment, the control unit 120 may divide the capacity section based on a preset ratio. For example, the control unit 120 may divide the capacity section by a ratio of n:m (wherein, n and m are positive numbers) to set the lower capacity section as the first section R1 and the upper capacity section as the second section R2.

For example, it is assumed that the starting capacity is Qi and the ending capacity is Qf. In addition, assuming that the capacity corresponding to the ratio of n:m is Qk, Qk may be calculated according to the formula of "(Qf−Qi)÷(n+m)×n." The control unit 120 may set the capacity section of Qi to Qk as the first section R1. And, the control unit 120 may set the capacity section of Qk to Qf as the second section R2.

In another embodiment, the control unit 120 may distinguish the capacity section by using a differential profile based on the battery profile BP.

The profile acquisition unit 110 may be configured to further acquire a differential profile corresponding to the battery profile BP.

For example, when the battery profile BP is differentiated with respect to the capacity, a differential profile indicating a correspondence between the differential voltage dV/dQ and the capacity Q may be generated. In addition, when the battery profile BP is differentiated with respect to the voltage, a differential profile indicating a correspondence between the differential capacity dQ/dV and the voltage V may be generated.

For example, the profile acquisition unit 110 may directly read or receive a differential profile of the battery from the outside. For example, the profile acquisition unit 110 may acquire a differential profile BP by being connected to the outside by wire and/or wirelessly and reading or receiving the differential profile.

In another example, the profile acquisition unit 110 may directly read or receive a battery profile BP of the battery from the outside, and generate a differential profile based on the battery profile BP. For example, the profile acquisition unit 110 may be connected to the outside by wire and/or wirelessly to read or receive the battery profile BP, and directly generate a differential profile from the corresponding battery profile BP, thereby acquiring a differential profile.

In another example, the profile acquisition unit 110 may generate a battery profile BP based on battery information about the voltage and capacity of the battery, and generate a differential profile based on the generated battery profile BP. In this way, the profile acquisition unit 110 may directly generate a differential profile based on the battery information, thereby acquiring a differential profile.

The profile acquisition unit 110 may be communicably connected to the control unit 120. For example, the profile acquisition unit 110 may be wired or wirelessly connected to the control unit 120. In an example, the profile acquisition unit 110 may transmit the acquired differential profile to the control unit 120. In another example, the control unit 120 may read the differential profile from the profile acquisition unit 110.

In one embodiment, the differential profile acquired by the profile acquisition unit 110 may be configured to represent a correspondence between the capacity Q of the battery and the differential voltage dV/dQ.

Figure 5:
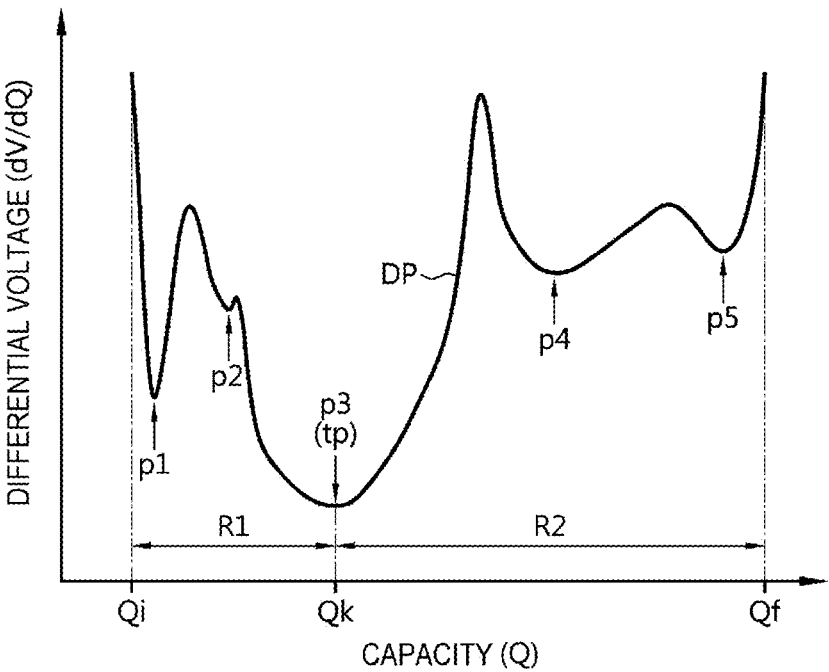
FIG. 5 is a schematic diagram illustrating a differential profile, according to one embodiment of the present disclosure.

FIG. 5 is a schematic diagram illustrating a differential profile DP according to one embodiment of the present disclosure. In the embodiment of FIG. 5, the differential profile DP may be expressed as an X-Y graph in which the X-axis is set to a capacity Q and the Y-axis is set to a differential voltage dV/dQ. For example, the differential profile DP of FIG. 5 has the same shape as the first differential profile of FIG. 3.

The control unit 120 may be configured to determine a main peak tp in the differential profile DP.

For example, the control unit 120 may be configured to determine a plurality of local minimum points in the differential profile DP. For example, in the embodiment of FIG. 5, the differential profile DP may include first to fifth local minimum points p1, p2, p3, p4, p5.

According to one embodiment, the control unit 120 may be configured to determine a local minimum point with the smallest corresponding differential voltage among the determined plurality of local minimum points, as the main peak tp. For example, in the embodiment of FIG. 5, since the differential voltage corresponding to the third local minimum point p3 is the smallest among the plurality of local minimum points p1, p2, p3, p4, p5, the control unit 120 may determine the third local minimum point p3 as the main peak tp.

The control unit 120 may be configured to divide the capacity section based on the capacity of the determined main peak tp. For example, in the embodiment of FIG. 5, when the capacity of the main peak tp is Qk, the control unit 120 may divide the capacity section into a first section R1 of Qi to Qk and a second section R2 of Qk to Qf.

In general, based on the local minimum point where the differential voltage is the smallest, the low-capacity side reflects the state of the negative electrode of the battery, and the high-capacity side reflects the state of the positive electrode of the battery. Therefore, the control unit 120 may distinguish the capacity section of the battery based on not only a certain ratio (n:m) but also the main peak tp.

In another example, the control unit 120 may determine the local minimum point with the smallest differential voltage, which is included in a lower-middle capacity section of the battery, as the main peak tp.

In general, when the capacity section of the battery is divided into a low-capacity section and a high-capacity section, the local minimum point with the smallest differential voltage is included in the low-capacity section. Therefore, the control unit 120 may determine the main peak tp in the lower-middle capacity section (low-capacity section) of the battery. For example, the control unit 120 may save time and system resources required to determine the main peak tp by determining the main peak tp among a plurality of local minimum points included in the low-capacity section.

For example, in the embodiment of FIG. 5, the low-capacity section includes the first to third local minimum points p1, p2, p3. The control unit 120 may determine the third local minimum point p3 with the smallest differential voltage among the first to third local minimum points p1, p2, p3 as the main peak tp.

In this way, since the numbers of local minimum points included in the entire capacity section and in the low-capacity section are different, the time and system resources required to compare the differential voltages of a plurality of local minimum points may also be different. Therefore, the control unit may determine the main peak more quickly by considering only the local minimum points included in the low-capacity section.

In another embodiment, the differential profile DP acquired by the profile acquisition unit 110 may be configured to represent a correspondence between the voltage V of the battery and the differential capacity dQ/dV.

The control unit 120 may be configured to determine a plurality of local maximum points in the differential profile DP. The local maximum point is a concept opposite to the local minimum point, and refers to a point that has an upward convex shape in the differential profile DP.

Moreover, the control unit 120 may be configured to determine the local maximum point with the largest corresponding differential voltage among the determined plurality of local maximum points, as the main peak.

The battery diagnosing apparatus 100 according to the present disclosure may be applied to a battery management system (BMS). For example, the BMS according to the present disclosure may include the battery diagnosing apparatus 100 described above. With the configuration, at least some of the components of the battery diagnosing apparatus 100 may be implemented by supplementing or adding the functions of the components included in the conventional BMS. For example, the profile acquisition unit 110, the control unit 120, and the storage unit 130 of the battery diagnosing apparatus 100 may be implemented as components of the BMS.

In addition, the battery diagnosing apparatus 100 according to the present disclosure may be equipped in a battery pack. In addition, the battery pack according to the present disclosure may include the battery diagnosing apparatus 100 described above and one or more battery cells. In addition, the battery pack may further include, for example, electrical components (e.g., relays and fuses) and a case.

Figure 6:
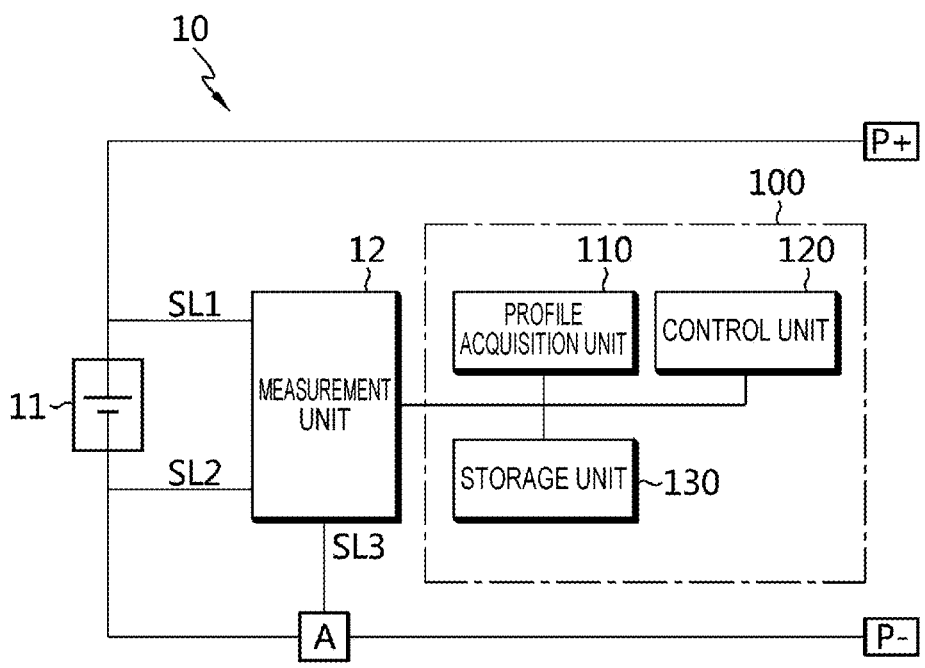
FIG. 6 is a schematic diagram illustrating a battery pack, according to another embodiment of the present disclosure.

FIG. 6 is a schematic diagram illustrating a battery pack 10 according to another embodiment of the present disclosure.

The positive terminal of the battery 11 may be connected to the positive terminal P+ of the battery pack 10, and the negative terminal of the battery 11 may be connected to the negative terminal P− of the battery pack 10.

A measurement unit 12 may be connected to a first sensing line SL1, a second sensing line SL2, and a third sensing line SL3. For example, the measurement unit 12 may be connected to the positive terminal of the battery 11 through the first sensing line SL1, and to the negative terminal of the battery 11 through the second sensing line SL2. The measurement unit 12 may measure the voltage of the battery 11 based on the voltage measured at each of the first sensing line SL1 and the second sensing line SL2.

Then, the measurement unit 12 may be connected to a current measurement unit A through the third sensing line SL3. For example, the current measurement unit A may be an ammeter or a shunt resistor capable of measuring the charging current and the discharging current of the battery 11. The measurement unit 12 may measure the charging current of the battery 11 through the third sensing line SL3 to calculate the charging amount. In addition, the measurement unit 12 may measure the discharging current of the battery 11 through the third sensing line SL3 to calculate the discharging amount.

For example, the profile acquisition unit 110 may read or receive battery information about the voltage and current of the battery from the measurement unit 12, and generate a battery profile BP and a differential profile DP based on the battery information.

In another example, the profile acquisition unit 110 may read or receive a battery profile BP from the measurement unit 12, and generate a differential profile DP based on the battery profile BP.

In another example, the profile acquisition unit 110 may read or receive a differential profile DP from the measurement unit 12.

An external device may be connected to the positive terminal P+ and the negative terminal P− of the battery pack 10. For example, the external device may be a charging device or a load. And, the positive terminal of the battery 11, the positive terminal P+ of the battery pack 10, the external device, the negative terminal P− of the battery pack 10, and the negative terminal of the battery 11 may be electrically connected.

Figure 7:
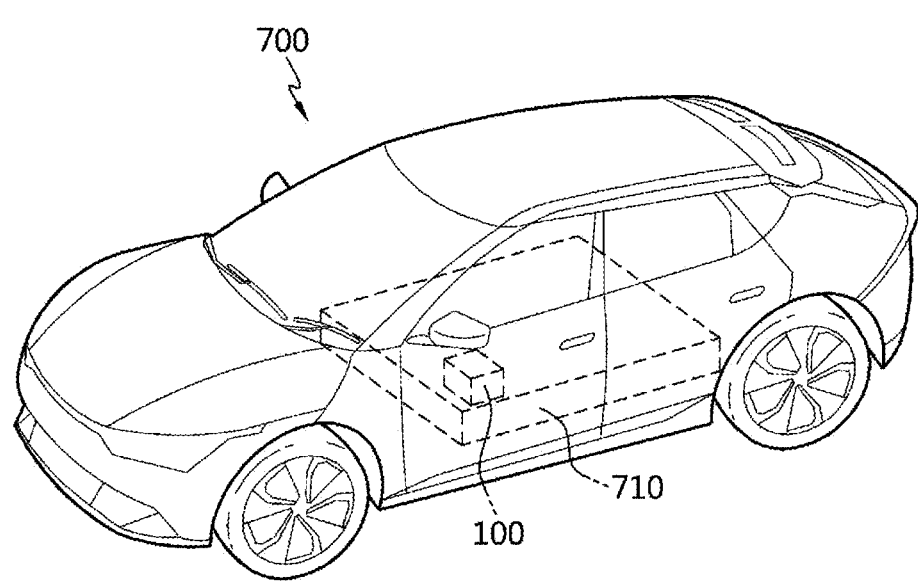
FIG. 7 is a schematic diagram illustrating a vehicle, according to yet another embodiment of the present disclosure.

FIG. 7 is a schematic diagram illustrating a vehicle 700 according to another embodiment of the present disclosure.

Referring to FIG. 7, a battery pack 710 according to an embodiment of the present disclosure may be included in the vehicle 700, such as an electric vehicle (EV) or a hybrid vehicle (HV). In addition, the battery pack 710 may drive the vehicle 700 by supplying power to a motor through an inverter equipped in the vehicle 700. Here, the battery pack 710 equipped in the vehicle may include the battery diagnosing apparatus 100 according to an embodiment of the present disclosure. In this case, the battery diagnosing apparatus 100 may be an on-board apparatus included in the vehicle 700.

Figure 8:
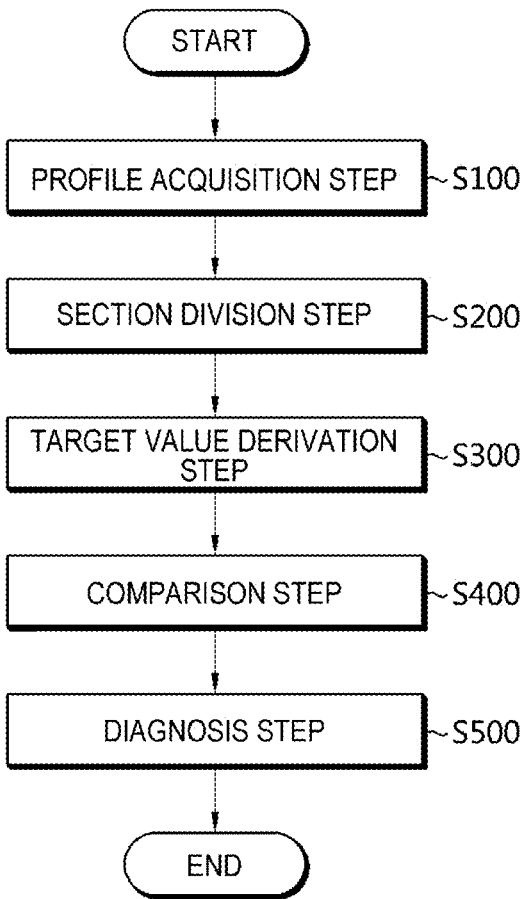
FIG. 8 is a schematic diagram illustrating a battery diagnosing method, according to still another embodiment of the present disclosure.

FIG. 8 is a schematic diagram illustrating a battery diagnosing method according to still another embodiment of the present disclosure.

Referring to FIG. 8, the battery diagnosing method may include a profile acquisition step (S100), a section division step (S200), a target value derivation step (S300), a comparison step (S400), and a diagnosis step (S500).

Each step of the battery diagnosing method may be performed by the battery diagnosing apparatus 100. In the following, for the convenience of explanation, any content that overlaps with the previously described content will be omitted or briefly described.

The profile acquisition step (S100) is a step of acquiring a battery profile BP that represents a correspondence between the voltage and capacity of the battery, and may be performed by the profile acquisition unit 110.

For example, the profile acquisition unit 110 may directly read or receive a battery profile BP of the battery from the outside. For example, the profile acquisition unit 110 may acquire a battery profile BP by being connected to the outside by wire and/or wirelessly and reading or receiving the battery profile BP.

In another example, the profile acquisition unit 110 may generate a battery profile BP based on battery information about the voltage and capacity of the battery. In this way, the profile acquisition unit 110 may acquire a battery profile BP by directly generating the battery profile BP based on the read or received battery information.

The section division step (S200) is a step of dividing the capacity section of the battery profile BP into a plurality of sections, and may be performed by the control unit 120.

According to one embodiment, the control unit 120 may divide the entire capacity section of the battery profile BP into two or more sections. For example, in the embodiment of FIG. 2, the entire capacity section of the battery profile BP is Qi to Qf. The control unit 120 may divide the capacity section of Qi to Qf into a first section R1 and a second section R2 based on Qk.

The target value derivation step (S300) is a step of deriving a target value for one target index related to a differential capacity peak or a charging capacity ratio among a plurality of diagnosis indices preset in each section, and may be performed by the control unit 120.

For example, in the embodiment of FIG. 3, the control unit 120 may select a target index for each of the first section R1 and the second section R2. Then, the control unit 120 may derive a target value corresponding to the selected target index.

The comparison step (S400) is a step of comparing the correspondence between the plurality of derived target values with a preset reference profile that represents a correspondence between the plurality of target indices, and may be performed by the control unit 120.

According to one embodiment, when the capacity section of the battery profile BP is divided into a first section R1 and a second section R2, and a first target value for a target index is derived in the first section R1 and a second target value for the target index is derived in the second section R2, the control unit 120 may compare target points representing a correspondence between a plurality of target values with a reference profile.

For example, in the embodiment of FIG. 4, the control unit 120 may determine whether the target point is included in the reference profile. When the target point is not included in the reference profile, the control unit 120 may determine which of a first region T1, a second region T2, and a third region T3 the target point is included in.

The diagnosis step S500 is a step of diagnosing the state of the battery based on the comparison result, and may be performed by the control unit 120.

For example, in the embodiment of FIG. 4, the control unit 120 may diagnose the state of the battery as a positive negative electrode deterioration state when the target point is included in the reference profile.

In another example, the control unit 120 may diagnose the state of the battery as a negative electrode deterioration state when the target point is included in the first region T1.

In yet another example, the control unit 120 may diagnose the state of the battery as a positive electrode deterioration state when the target point is included in the second region T2.

In still another example, the control unit 120 may diagnose the state of the battery as an EOL state when the target point is included in the third region T3.

The embodiments of the present disclosure described above may be implemented not only by an apparatus and method, but also by programs implementing functions corresponding to the components of the embodiments of the present disclosure or by a recording medium that stores the programs. This implementation may readily be achieved by one skilled in the art to which the present disclosure belongs, from the descriptions of the embodiments above.

While the present disclosure has been described using limited embodiments and drawings, the present disclosure is not limited thereto, and it may be appreciated that various modifications and changes may be made by those having ordinary skill in the art of the present disclosure within the technical idea of the present disclosure and the equitable scope of the claims set forth below.

Further, since various substitutions, modifications, and changes may be made by those having ordinary skill in the art of the present disclosure within the scope that does not depart from the technical idea of the present disclosure, the present disclosure described above is not limited by the foregoing embodiments and the accompanying drawings, but all or portions of the embodiments may be selectively combined to implement various modifications.

DESCRIPTION OF SYMBOLS

10: battery pack
11: battery
12: measurement unit
100: battery diagnosing apparatus
110: profile acquisition unit
120: control unit
130: storage unit
700: vehicle
710: battery

What is claimed is:

1. A battery diagnosing apparatus comprising:
a profile acquisition unit configured to acquire a battery profile representing a correspondence between a voltage and a capacity of a battery; and
a control unit configured to:
    divide a capacity section of the battery profile into a plurality of sections,
    derive a plurality of target values, wherein each target value of the plurality of target values is related to a differential capacity peak index or a charging capacity ratio index among a plurality of diagnosis indices set in advance and is for a section of the plurality of sections,
    compare a correspondence between the plurality of target values with a preset reference profile that represents a correspondence between a plurality of target indices,
    diagnose a deterioration state of the battery based on a result of the comparison, and reduce an upper limit current-rate (C-rate), a constant voltage charging time or an upper charge limit voltage set for the battery based on the deterioration state of the battery, wherein at least one target value of the plurality of target values is related to a charging capacity ratio index.

2. The battery diagnosing apparatus according to claim 1, wherein the control unit is configured to:

determine a number of a plurality of differential capacity peaks included in a differential profile corresponding to the battery profile, the differential profile representing a correspondence between a voltage and a differential capacity, determine the differential capacity peak index as an area of the differential profile, a voltage of a main peak among the plurality of differential capacity peaks, or a differential capacity of the main peak in a corresponding low-capacity section among the plurality of sections, and determine the charging capacity ratio index in a corresponding high-capacity section among the plurality of sections.

3. The battery diagnosing apparatus according to claim 1, wherein the control unit is configured to:

diagnose the deterioration state of the battery as a positive negative electrode deterioration state when a target point indicating the correspondence between the plurality of target values is included in the preset reference profile, diagnose the deterioration state of the battery as a negative electrode deterioration state when the target point is included in a first region based on the preset reference profile, and diagnose the deterioration state of the battery as a positive electrode deterioration state when the target point is included in a second region based on the preset reference profile.

4. The battery diagnosing apparatus according to claim 3, wherein the control unit is configured to diagnose the deterioration state of the battery as an end of life (EOL) state when the target point is included in a third region, and the third region is configured to be preset as a region that exceeds a preset threshold value for each of the plurality of target indices.

5. The battery diagnosing apparatus according to claim 3, wherein the control unit is configured to reduce the upper limit current-rate (C-rate) or the constant voltage charging time set for the battery when the deterioration state of the battery is diagnosed as the positive electrode deterioration state or the positive negative electrode deterioration state.

6. The battery diagnosing apparatus according to claim 3, wherein the control unit is configured to reduce the upper charge limit voltage set for the battery when the deterioration state of the battery is diagnosed as the negative electrode deterioration state or the positive negative electrode deterioration state.

7. The battery diagnosing apparatus according to claim 1, wherein the control unit is configured to divide the capacity section into a first section and a second section based on a division ratio or a target capacity set in advance.

8. The battery diagnosing apparatus according to claim 7, wherein the profile acquisition unit is configured to further acquire a differential profile corresponding to the battery profile, and the control unit is configured to determine a main peak from the differential profile and divide the capacity section based on a capacity of the determined main peak.

9. The battery diagnosing apparatus according to claim 8, wherein the differential profile is configured to represent a correspondence between a capacity of the battery and a differential voltage, and the control unit is configured to determine a plurality of local minimum points in the differential profile, and determine a local minimum point with a smallest corresponding differential voltage among the determined plurality of local minimum points, as the main peak.

10. The battery diagnosing apparatus according to claim 8, wherein the differential profile is configured to represent a correspondence between a voltage and a differential capacity of the battery, and the control unit is configured to determine a plurality of local maximum points in the differential profile, and determine a local maximum point with a largest corresponding differential voltage among the determined plurality of local maximum points, as the main peak.

11. A battery pack comprising the battery diagnosing apparatus according to claim 1.

12. A vehicle comprising the battery diagnosing apparatus according to claim 1.

13. A battery diagnosing method comprising:

acquiring a battery profile representing a correspondence between a voltage and a capacity of a battery;

dividing a capacity section of the battery profile into a plurality of sections;

deriving a plurality of target values, wherein each target value of the plurality of target values is related to a differential capacity peak index or a charging capacity ratio index among a plurality of diagnosis indices set in advance and is for a section of the plurality of sections;

comparing a correspondence between the plurality of target values with a preset reference profile that represents a correspondence between a plurality of target indices;

diagnosing a deterioration state of the battery based on a result of the comparison; and reducing an upper limit current-rate (C-rate), a constant voltage charging time or an upper charge limit voltage set for the battery based on the deterioration state of the battery, wherein at least one target value of the plurality of target values is related to a charging capacity ratio index.

14. The battery diagnosing method according to claim 13, further comprising:

determining a number of a plurality of differential capacity peaks included in a differential profile corresponding to the battery profile, the differential profile representing a correspondence between a voltage and a differential capacity, determine the differential capacity peak index as an area of the differential profile, a voltage of a main peak among the plurality of differential capacity peaks, or a differential capacity of the main peak in a corresponding low-capacity section among the plurality of sections, and determining the charging capacity ratio index in a corresponding high-capacity section among the plurality of sections.

15. The battery diagnosing method according to claim 13, wherein diagnosing the deterioration state of the battery based on a result of the comparison:

diagnosing the deterioration state of the battery as a positive negative electrode deterioration state when a target point indicating the correspondence between the plurality of target values is included in the preset reference profile, diagnosing the deterioration state of the battery as a negative electrode deterioration state when the target point is included in a first region based on the preset reference profile, and diagnosing the deterioration state of the battery as a positive electrode deterioration state when the target point is included in a second region based on the preset reference profile.

16. The battery diagnosing method according to claim 15, wherein diagnosing the deterioration state of the battery based on a result of the comparison includes diagnosing the deterioration state of the battery as an end of life (EOL) state when the target point is included in a third region, and the third region is preset as a region that exceeds a preset threshold value for each of the plurality of target indices.

17. The battery diagnosing method according to claim 15, further comprising:

reducing the upper limit current-rate (C-rate) or the constant voltage charging time set for the battery when the deterioration state of the battery is diagnosed as the positive electrode deterioration state or the positive negative electrode deterioration state.

18. The battery diagnosing method according to claim 15, further comprising:

reducing the upper charge limit voltage set for the battery when the deterioration state of the battery is diagnosed as the negative electrode deterioration state or the positive negative electrode deterioration state.

19. The battery diagnosing method according to claim 13, wherein dividing the capacity section of the battery profile into the plurality of sections includes dividing the capacity section into a first section and a second section based on a division ratio or a target capacity set in advance.

20. A non-transitory computer-readable storage medium having stored therein a program that, when executed, causes a computer to execute a battery diagnosing method comprising:

acquiring a battery profile representing a correspondence between a voltage and a capacity of a battery;

dividing a capacity section of the battery profile into a plurality of sections;

deriving a plurality of target values, wherein each target value of the plurality of target values is related to a differential capacity peak index or a charging capacity ratio index among a plurality of diagnosis indices set in advance and is for a section of the plurality of sections;

comparing a correspondence between the plurality of target values with a preset reference profile that represents a correspondence between a plurality of target indices;

diagnosing a deterioration state of the battery based on a result of the comparison; and reducing an upper limit current-rate (C-rate), a constant voltage charging time or an upper charge limit voltage set for the battery based on the deterioration state of the battery, wherein at least one target value of the plurality of target values is related to a charging capacity ratio index.

* * * * *